United States Patent [19]

Sakamoto

[11] 4,361,906
[45] Nov. 30, 1982

[54] CHANNEL SELECTOR HAVING A PLURALITY OF TUNING SYSTEMS

[75] Inventor: Yoichi Sakamoto, Takatsuki, Japan

[73] Assignee: Matsushita Electric Industrial Co., Ltd., Osaka, Japan

[21] Appl. No.: 111,477

[22] Filed: Jan. 7, 1980

[30] Foreign Application Priority Data

Jan. 10, 1979 [JP] Japan ................................. 54-1591

[51] Int. Cl.³ .......................... H03L 7/22; H04B 1/26
[52] U.S. Cl. ....................................... 455/140; 331/2;
          331/14; 455/141; 455/165; 455/183
[58] Field of Search ................................ 455/132–141,
          455/183, 165, 167, 142, 143; 331/2, 14

[56] References Cited

U.S. PATENT DOCUMENTS

| | | | |
|---|---|---|---|
| 2,620,437 | 12/1952 | Zappacosta | 455/141 |
| 2,626,315 | 1/1953 | Farr | 455/142 |
| 2,666,853 | 1/1954 | O'Brien | 455/143 |
| 3,745,467 | 7/1973 | Lundquist et al. | 455/143 |
| 3,927,384 | 12/1975 | Jezo | 331/2 |
| 4,123,724 | 10/1978 | Das et al. | 455/183 |
| 4,317,228 | 2/1982 | Hendrickson | 331/2 |

*Primary Examiner*—Marc E. Bookbinder
*Attorney, Agent, or Firm*—Wenderoth, Lind & Ponack

[57] ABSTRACT

A channel selector characterized in that a plurality of receivers capable of simultaneously performing a receiving operation have a main part of a phase-locked loop frequency synthesizer connected in common thereto, the frequency synthesizer having a programmable frequency divider, a phase comparator, a reference oscillator and a reference frequency divider. The frequency synthesizer is controlled so that a local oscillation frequency corresponding to a determined frequency close to a broadcast signal of a desired receiving channel is synthesized, and one of a plurality of search tuning systems searches and tunes the broadcast signal from the local oscillation frequency.

9 Claims, 11 Drawing Figures

CHANNEL SELECTOR HAVING A PLURALITY OF TUNING SYSTEMS

BACKGROUND OF THE INVENTION

This invention relates to a channel selector for use in television receivers, FM (frequency modulation) radio receivers, AM (amplitude modulation) radio receivers and so on.

FIG. 1 is a block diagram of a conventional channel selector using a PLL (phase-locked loop) frequency synthesizer. The PLL frequency synthesizer has a loop consisting of a voltage controlled local oscillator 1, a prescaler 2, a programmable frequency divider 3, a phase comparator 4 and a low pass filter 5 and has a configuration such that an output of a reference oscillator 6 is divided by a reference frequency divider 7 and applied to an input terminal of the phase comparator 4, and an output code of a code converter 9 controlled by a channel entry apparatus 8 determines the frequency dividing ratio of the programmable frequency divider 3, the output of which is applied to the other input terminal of the phase comparator 4. The local oscillating frequency of a desired receiving channel is synthesized by the PLL frequency synthesizer mentioned above. The local oscillation output and the output of a radio frequency amplifier 10 are mixed in a mixer 11 so as to obtain an intermediate frequency output. This output is amplified in an intermediate frequency amplifier 12 and detected in a detector 13. The detected signal is conveyed through an output circuit 14 and applied to an output apparatus 15. A channel number indicator 16 indicates which channel is received.

Recently, home-video-tape recorders (VTR) have been widely used. Using such VTR, a record-desired program which is simultaneously received with the other on-screen program can be recorded. And recently, sound-multiplex in television broadcast started in Japan. Because the sound became stereophonic, a tuner unit which incorporates television-channel selector, FM and AM radio-channel selector is desired to be developed. Further in future, development of the independent use of the sound multiplex broadcast such as facsimile is expected. In such cases, a plurality of receivers is necessary, and if a channel selector is provided with each of said receivers, a plurality of channel selectors are necessary, but this is not undesirable from the view point of cost.

SUMMARY OF THE INVENTION

This invention is intended to reduce the cost of channel selectors and to simplify the design of a PLL having desired characteristics, by having the main part of a PLL frequency synthesizer used in a receiver made available for common use with a plurality of receivers.

Accordingly, it is an object of this invention to provide a suitable channel selector, e.g. for a television receiver, which incorporates a video tape recorder.

It is another object of this invention to provide a suitable channel selector, e.g. for a television receiver, which incorporates a radio receiver.

It is still another object of this invention to provide a suitable channel selector, e.g. of a television receiver, for independent use of the sound multiplex broadcast such as facsimile which is expected to be practical in future.

BRIEF DESCRIPTION OF THE DRAWINGS

Details of this invention will be described hereinafter with reference to the accompanying drawings, in which.

DESCRIPTION OF PREFERRED EMBODIMENTS

Figure 1:
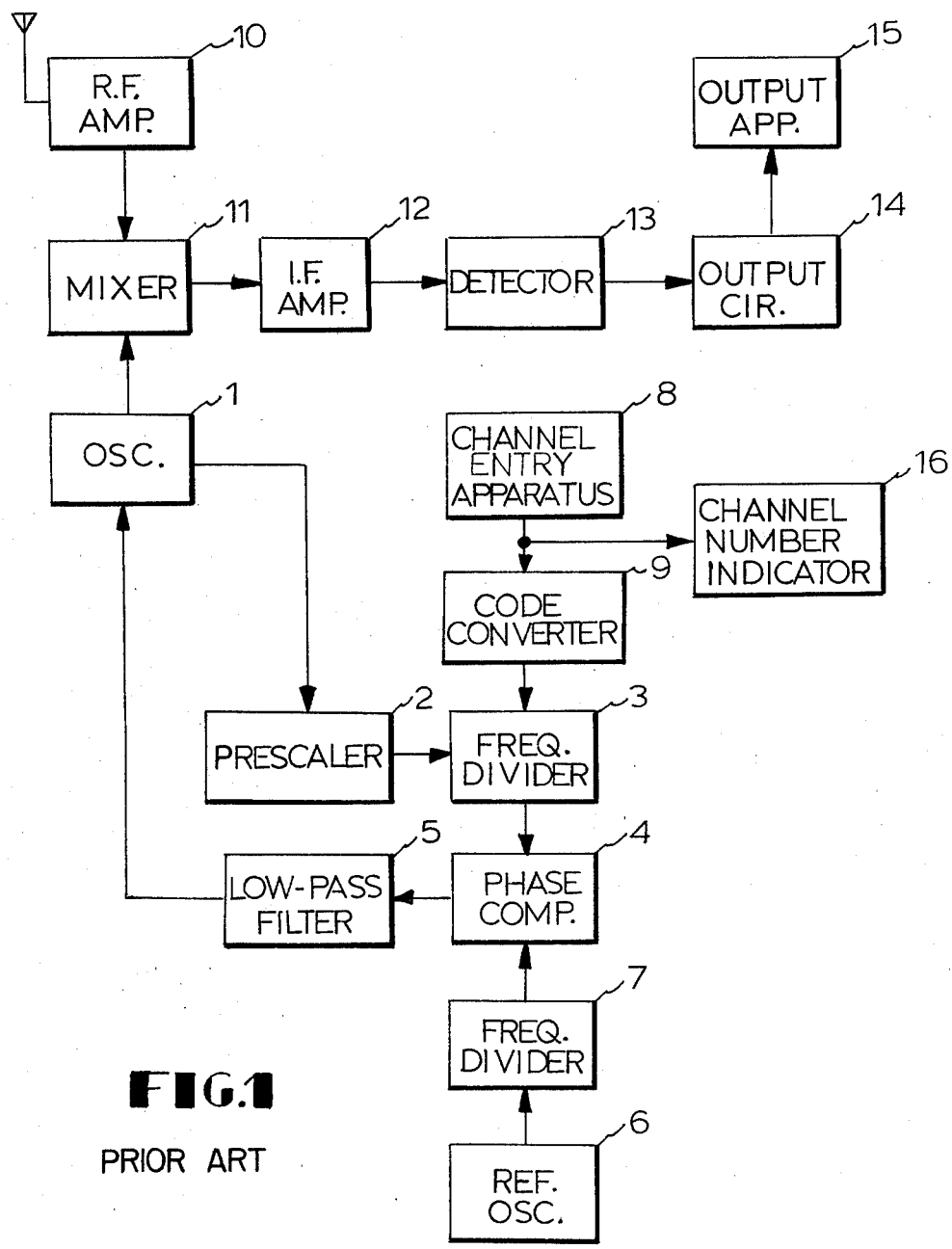
FIG. 1 is a block diagram of a conventional channel selector.
Figure 2:
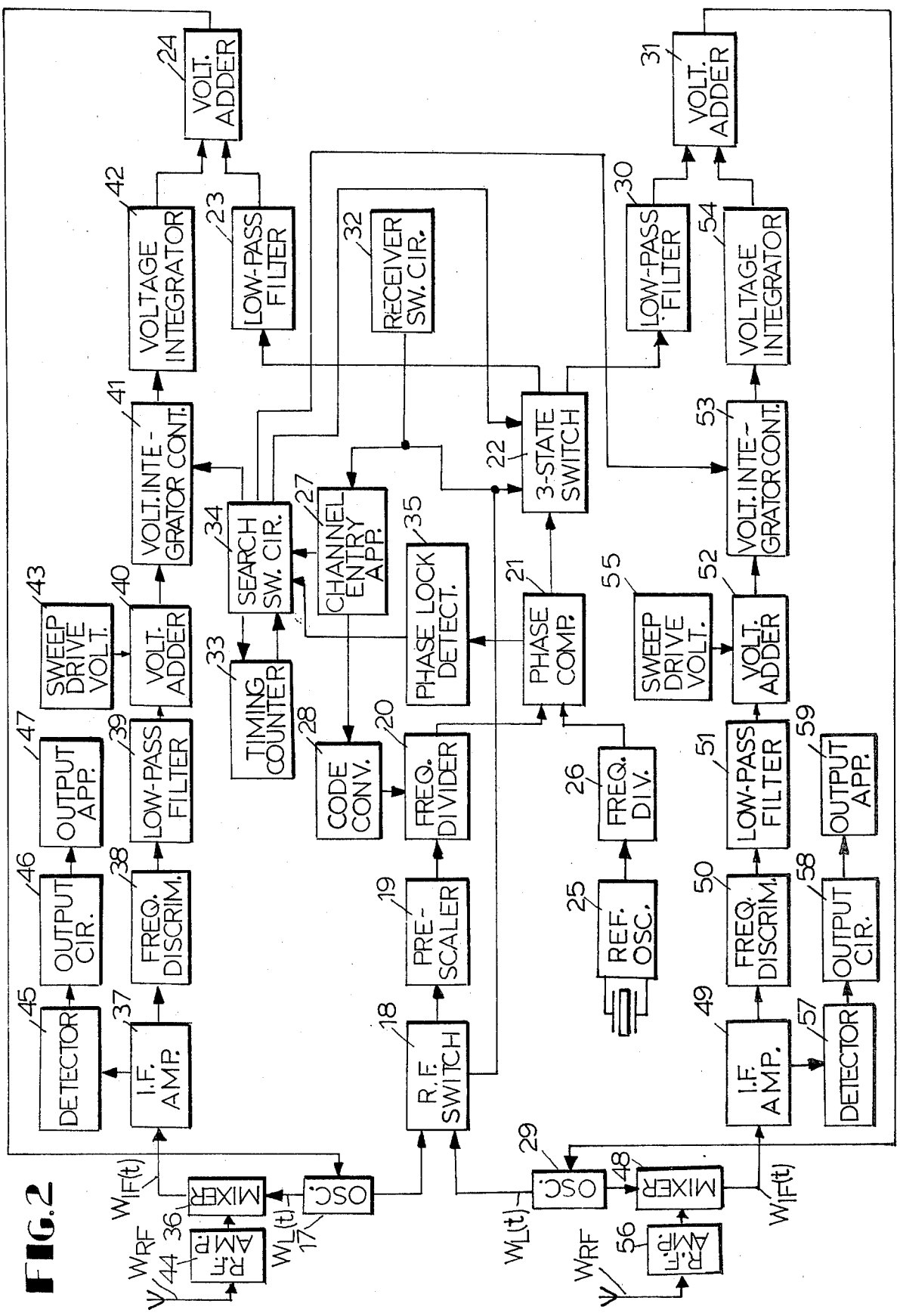
FIG. 2 is a block diagram of a channel selector according to an embodiment of the present invention.

In FIG. 2, two PLL frequency synthesizers are shown. The first one has a loop consisting of a local oscillator (voltage controlled oscillator) 17, a radio frequency switch 18, a prescaler 19, a programmable frequency divider 20, a phase comparator 21, a 3-state switch circuit 22, a low pass filter 23, and a voltage adder 24; the first synthesizes has a configuration such that an output of a reference oscillator 25 is divided by a reference frequency divider 26 and applied to an input terminal of the phase comparator 21, and an output code of a code converter 28, controlled by a channel entry apparatus 27, determines the frequency dividing ratio of the programmable frequency divider 20, the output of which is applied to the other input terminal of the phase comparator 21.

The second PLL frequency synthesizer has a loop consisting of a local oscillator (voltage controlled oscillator) 29, the radio frequency switch 18, the prescaler 19, the programmable frequency divider 20, the phase comparator 21, the 3-state switch circuit 22, a low pass filter 30 and a voltage adder 31; the second synthesizer has a configuration such that an output of the reference oscillator 25 is divided by a reference frequency divider 26 and applied to the input terminal of the phase comparator 21, and an output code of the code converter 28, controlled by the channel entry apparatus 27, determines the frequency dividing ratio of the programmable frequency divider 20, the output of which is applied to the other input terminal of the phase comparator 21. Therefore, the second PLL frequency synthesizer uses the prescaler 19, the programmable frequency divider 20, the phase comparator 21, the reference oscillator 25, the reference frequency divider 26, the channel entry apparatus 27 and the code converter 28 commonly with the first PLL frequency synthesizer. Here, one of these or the part of the combination of these is defined as a main part of the PLL frequency synthesizer. A receiver switch circuit 32 controls the radio frequency switch 18 and the 3-state switch circuit 22 so as to close either of the loops used in the first or the second PLL frequency synthesizer mentioned above.

Figure 3:
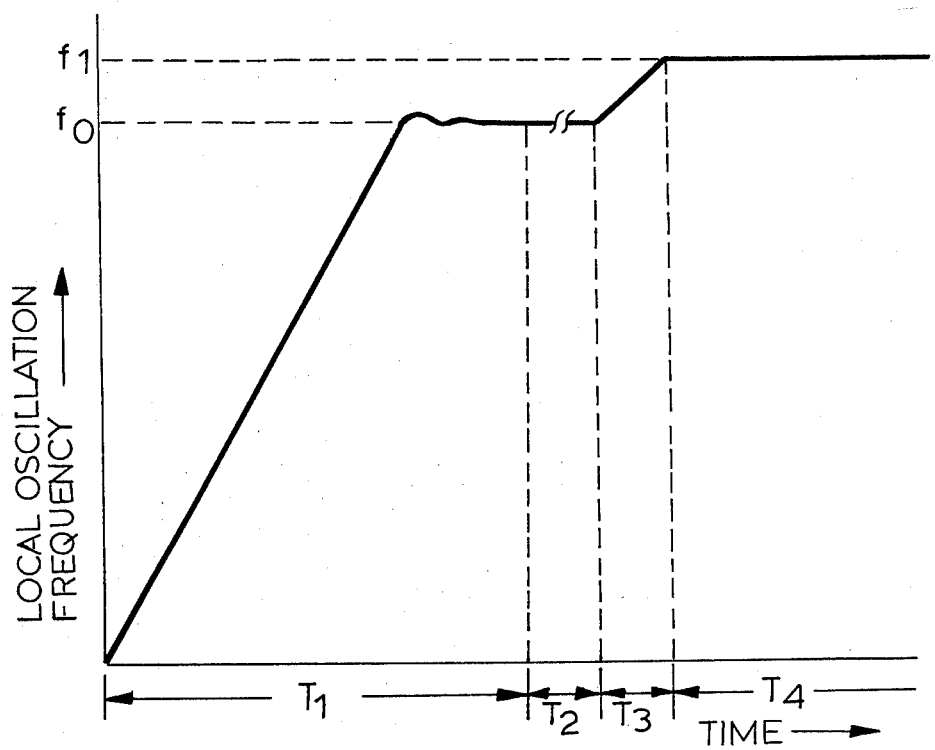
FIG. 3 is a diagram showing the relationship between time and the local oscillation frequency for facilitating the explanation of the operation of the embodiment.

A PLL timing counter 33 is used for counting the time T₁, shown in FIG. 3, which determines the period when the PLL is closed, and a PLL-search switch circuit 34 is controlled by the PLL timing counter 33, the channel entry apparatus 27 or the output of a phase lock detector 35.

In the embodiment of this invention shown in FIG. 2, two search tuning systems are indicated. The first one has a loop consisting of the local oscillator 17, a mixer 36, an intermediate frequency amplifier 37, a frequency discriminator 38, a low pass filter 39, a voltage adder 40, a voltage integrator controller 41, a voltage integrator 42 and the voltage adder 24; the first system has a configuration such that an output voltage of a sweep driving voltage source 43 is applied to the voltage adder 40, and an output of a radio frequency amplifier 44 is applied to the mixer 36. The output of the intermediate frequency amplifier 37 is detected in a detector 45, and the detected signal is conveyed through an output circuit 46 and applied to an output apparatus 47.

Similarly, the second search tuning system has a loop consisting of the local oscillator 29, a mixer 48, an intermediate frequency amplifier 49, a frequency discriminator 50, a low pass filter 51, a voltage adder 52, a voltage integrator controller 53, a voltage integrator 54 and the voltage adder 31; the second system has a configuration such that an output voltage of a sweep-driving-voltage source 55 is applied to the voltage adder 52, and an output of a radio frequency amplifier 56 is applied to the mixer 48. The output of the intermediate frequency amplifier 49 is detected in a detector 57, and the detected signal is conveyed through an output circuit 58 and applied to an output apparatus 59.

In the radio frequency amplifiers 44 and 56, the tuning frequency is controlled by a tuning voltage so as to maintain tracking with the oscillating frequency of the local oscillator 17s and 29, respectively.

The radio frequency switch circuit 18 and the 3-state switch circuit 22 are controlled by the receiver switch circuit 32 and the above-mentioned first frequency synthesizer is ready to operate. In other words, the first receiver is ready to select a channel. Then, among the stations which can be received by this receiver, the channel number or the receiving frequency of the desired receiving station is selected by the channel entry apparatus 27.

The dividing ratio corresponding to the selected channel is loaded by the programmable frequency divider 20 through the code converter 28. At the same time, the channel entry apparatus 27 controls the PLL-search switch circuit 34, and the output of this switch circuit 34 switches the 3-state switch circuit 22 so as to close the first PLL and controls the voltage integrator controller 41 so as to cause the output of the voltage integrator 42 to be at a sweep-starting reference voltage.

During the time T₁ shown in FIG. 3, the local oscillation frequency is controlled by the closed PLL in above-mentioned manner so as to get close to the frequency $f_o$ which has been predetermined so as to be close to the local oscillation frequency corresponding to the transmitting frequency of the desired receiving channel and so as to finally be locked to the frequency $f_o$. During the same time, the output of the voltage integrator 42 remains at the sweep-starting reference voltage.

During time T₂, the PLL is kept in the closed loop state, and the output of the voltage integrator 42 is brought to a sweeping state. In this period, the local oscillation frequency is nearly equal to the steady state local oscillation frequency during the time T₁. The reason will be described in detail later, but that condition arises, because the output of the low pass filter 23 of the PLL decreases by the increment of the output of the voltage integrator 42.

When the output of the low pass filter 23 reaches the limit of decrease, the output from the phase lock detector 35 indicates that the unlocking of the phase has occurred. The time when this output occurs is determined to be the time which is the end of the time T₂ or the time which is the beginning of the time T₃.

The output of the phase lock detector 35 controls the PLL-search switch circuit 34. This PLL-search switch circuit 34 causes the input terminal of the low pass filter 23 to be at a floating state through the 3-state switch circuit 22 and controls the voltage integrator controller 41 so that the first search tuning system is in a sweeping state. That is, during the time T₃ the PLL is in an open loop and the search tuning system is in closed loop.

When the local oscillation frequency reaches $f_1$ of FIG. 3, that is, when the local oscillation frequency reaches the local oscillation frequency corresponding to the tranmitting frequency of the desired receiving station, the search tuning system forms a negative feedback loop and receives the desired station. The period during this state is determined during time T₄.

During this time T₄, the first PLL continues in an open-loop state like the state during the time T₃ and is not used in the first receiver. Therefore, controlling the radio frequency switch circuit 18 and the 3-state switch circuit 22 by the receiver switch circuit 32, the prescaler 19, the programmable frequency divider 20, the phase comparator 21, the reference oscillator 25, the reference frequency divider 26, the channel entry apparatus 27 and the code converter 28 which have been used in the first frequency synthesizer can be used in the second PLL frequency synthesizer. The channel-selection manner in this case is similar to the manner described above with respect to the first PLL frequency synthesizer and the first search tuning system, so that the explanation of this case is omitted.

The operation of the PLL frequency synthesizer and the search tuning system during the time T₂, T₃ and T₄ will be explained in more detail below.

Figure 4A:
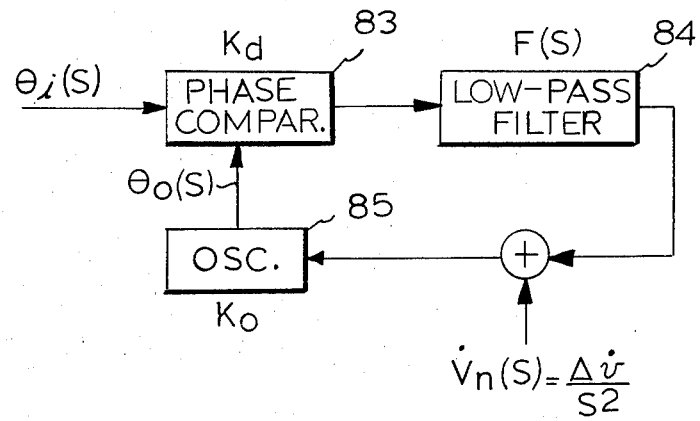
FIGS. 4a and 4b are block diagrams of the model of a PLL.
Figure 4B:
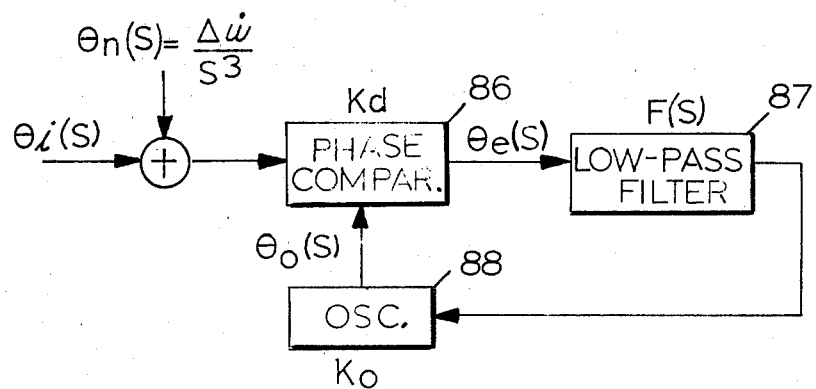

Referring to FIGS. 4a and 4b, operation of the PLL is explained as follows. During this time, the PLL is in a locked state, and a sweeping voltage $V_n(s) = \Delta\dot{v}/(s^2)$ is added to this loop as a disturbing noise as shown in FIG. 4a. Here, $\Delta\dot{v}$ is voltage sweeping rate of the output of the voltage integrator 42 or 54 (refer to FIG. 2), s is a Laplace complex variable, $\theta_i(s)$ is the reference phase of a phase comparator 83, $K_d$ is the sensitivity of the phase comparator 83, F(s) is the transfer function of a low pass filter 84, $K_o$ is the sensitivity of a voltage controlled oscillator 85, and $\theta_o(s)$ is the output phase of the oscillator 85. If:

$$\Delta\dot{\omega} = K_o \times \Delta\dot{v} \qquad (1)$$

FIG. 4a may be transformed to FIG. 4b, that is, a disturbing phase $\theta_n(s) = \Delta\dot{\omega}/(s^3)$ is added to the reference input phase $\theta_i(s)$ of a phase comparator 86. The phase comparator 86, a low pass filter 87 and a voltage controlled oscillator 88 have the same characteristics as those of the elements 83, 84 and 85, respectively.

If the output $\theta_e(s)$ of the phase comparator 86 is:

$$\theta_e(s) = \theta_i(s) - \theta_o(s) \quad (2)$$

from FIG. 4b:

$$\theta_e(s) = \frac{s[\theta_i(s) + \{\Delta\dot\omega/(s^3)\}]}{s + K_oK_dF(s)} \quad (3)$$

The steady-state frequency error $$\theta_e = \lim_{t\to\infty} \frac{d\theta_e(t)}{dt}$$

is obtained by the final value theorem:

$$\lim_{t\to\infty} \frac{d\theta_e(t)}{dt} = \lim_{s\to 0} s[s\theta_e(s)] \quad (4)$$

$$= \lim_{s\to 0} s^2 \left[ \frac{s\left(\theta_i(s) + \frac{\Delta\dot\omega}{s^3}\right)}{s + K_oK_dF(s)} \right]$$

$$= \frac{\Delta\dot\omega}{K_oK_dF(0)}$$

$$= \frac{\Delta\dot\omega}{K_v}$$

where $K_v = K_oK_dF(0)$. If an active filter is used as the low pass filter 87, $K_v$ may be chosen to have a value large enough to make negligible the frequency error $$\lim_{t\to\infty} = \frac{d\theta_e(t)}{dt}.$$

In other words, the local oscillation frequency during the time $T_2$ shown in FIG. 3 is nearly equal to said frequency during the time $T_1$. The time of this $T_2$ continues until the input voltage of the voltage adder 24 or 31 from the voltage integrator 42 or 54 reaches the voltage corresponding to the frequency $f_o$ shown in FIG. 3.

If the frequency $f_o$ is the local oscillation frequency corresponding to a predetermined frequency which is close to the transmitting frequency of a desired receiving channel, the channel selector shown in FIG. 2 establishes said predetermined frequency and stands by to search the transmitting frequency from this frequency.

Figure 6:
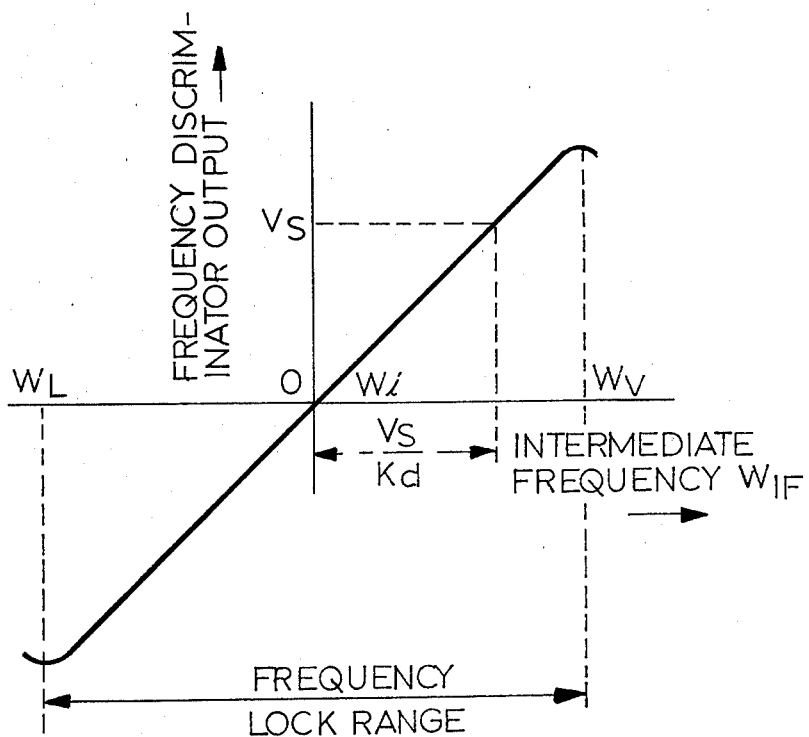
FIG. 6 is a diagram showing the relationship between the frequency discriminator characteristics and the frequency error of the search tuning system.

Referring to a model shown in FIGS. 5a and 5b and the frequency-discriminator characteristics shown in FIG. 6, operation of search tuning system during the time $T_3$ and $T_4$ shown in FIG. 3 is explained as follows.

Figure 5A:
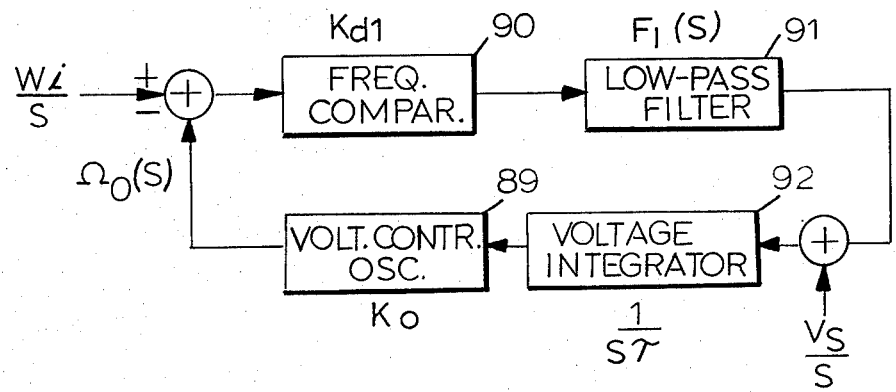
FIGS. 5a and 5b are block diagrams of the model of a search tuning system.

The difference $\omega_{IF}(t)$ between the local oscillation frequency $\omega_L(t)$ and receiving frequency $\omega_{RF}$ shown in FIG. 2 is taken to be equivalent to the output $\omega_o(t)$ of the voltage controlled oscillator (VCO) 89 shown in FIG. 5a, where the Laplace transform of $\omega_o(t)$ is $\Omega_o(s)$. And correspondingly, the frequency discriminator 38 or 50 shown in FIG. 2 is represented by a frequency comparator 90 which indicates the frequency difference between a reference input frequency $\omega_i/s$ and output $\Omega_o(s)$ of the VCO 89 in FIG. 5a.

Figure 5B:
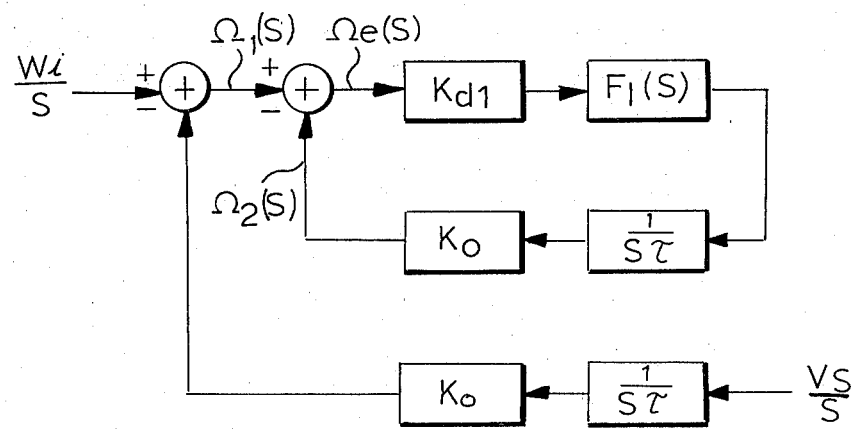

In order to move the point (at which a sweep driving voltage $V_s/s$ in FIG. 5a is applied to the system) to the reference input side of the search tuning system, an equivalent model shown in FIG. 5b is derived. From FIG. 5b:

$$\Omega_e(s) = \frac{\omega_i\tau - (K_oV_s/s)}{s\tau + K_oK_{dl}F(s)} \quad (5)$$

where $\omega_i$ is a reference frequency determined from the characteristics of the frequency discriminator which has linear output characteristics with respect to frequency, $K_{dl}$ is the sensitivity of the frequency comparator 90, $F(s)$ is the transfer function of a low pass filter 91 and $\tau$ is the time constant of a voltage integrator 92.

From the final value theorem, steady-state frequency error $\omega_e$ is obtained as:

$$\omega_e = \lim_{t\to\infty} \omega_e(t) \quad (6)$$

$$= \lim_{s\to\infty} s\,\Omega_e(s)$$

$$= \lim_{s\to 0} \frac{s\omega_i\tau - K_oV_s}{s\tau + K_oK_{dl}F(s)}$$

Figure 8:
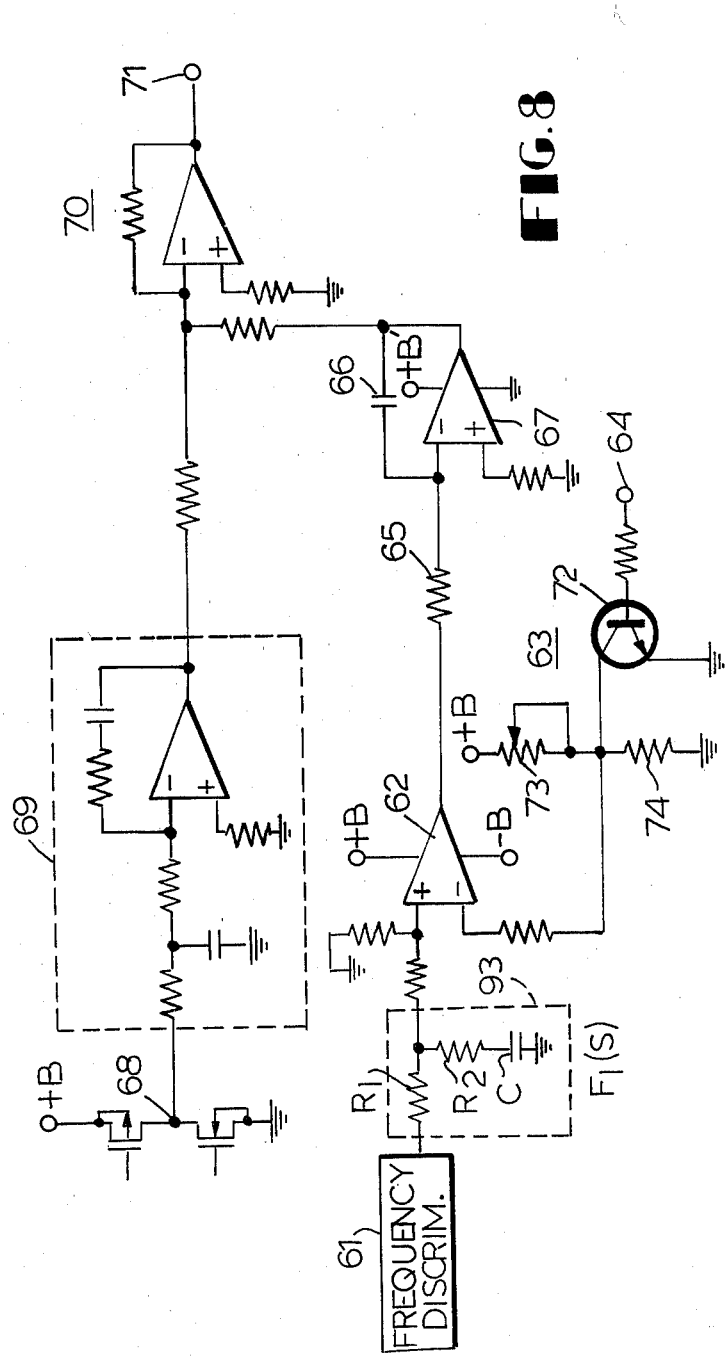
FIG. 8 is a circuit diagram showing a practical form of the connection of the PLL and the search tuning system for use in the present invention.

If a lag-lead filter 93 shown in FIG. 8 is used as the low pass filter, $$F(s) = \frac{s\tau_2 + 1}{s(\tau_1 + \tau_2) + 1} \quad (7)$$

where $\tau_1 = R_1C$ and $\tau_2 = R_2C$.

In this case, from equation (6):

$$\omega_e = -V_s/K_d \quad (8)$$

This equation shows that the steady-state-frequency error is independent of the sensitivity $K_o$ of the VCO 89, and therefore it shows that the error is independent of the sensitivity of the local oscillator 17 or 29 shown in FIG. 2. The equation also shows that by making the sweep driving voltage $V_s$ variable, the intermediate frequency is variable in the range of the frequency-lock range shown in FIG. 6.

During time of $T_4$, according to the operation mentioned above, the search tuning system tunes an arriving signal, or a receiving signal. Even if the arriving signal has an offset frequency with respect to a nominal transmitting frequency, this system always follows the arriving signal.

Figure 7:
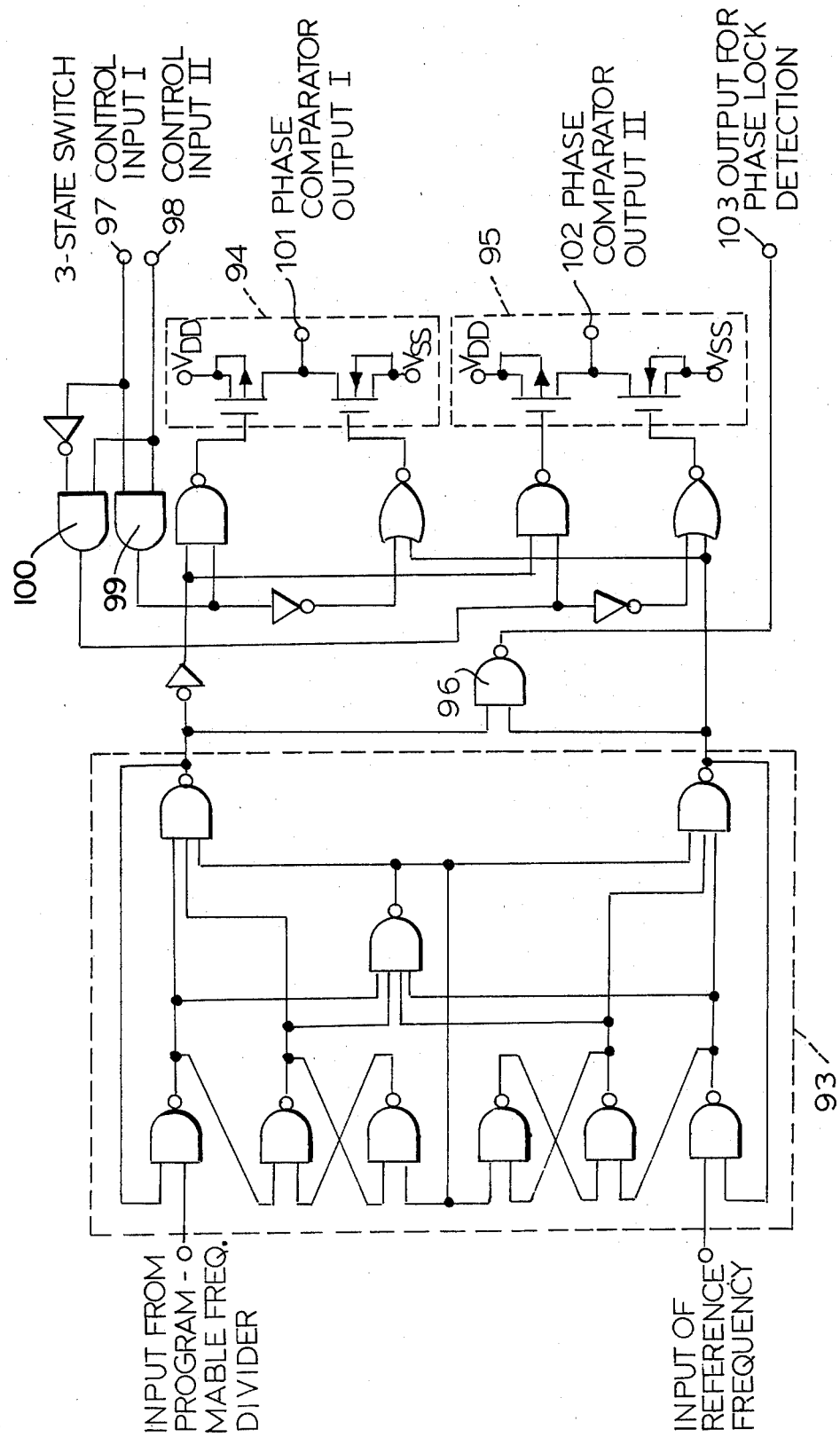
FIG. 7 is a circuit diagram showing a practical form of a 3-state switch for use in the present invention.

An example of a practical configuration of the 3-state switch circuit 22 is explained as follows using FIG. 7. A phase comparator 93, charge pump circuits 94 and 95, which have three output states, namely—a high level, a low level, and a floating (high impedance) output, and a gate 96 used for phase-lock detection are generally known, and their operations are well known. Accordingly, their detailed explanations are omitted here. The remaining elements of FIG. 7, except for the above-mentioned circuits form a 3-state switch circuit.

A terminal 97 of control input I for the 3-state switch is connected to an output terminal of the receiver switch circuit 32 shown in FIG. 2, and a terminal 98 of control input II for the 3-state switch is connected to the PLL-search switch circuit 34 shown in FIG. 2. When the control input I is at a high level, a gate 99 is opened, and further when the control input II is at high level, phase comparator output I charges or pumps the capacitor of the low pass filter 23 connected to terminal 101 so as to close the first PLL. When the control input II is brought to a low level, phase comparator output I is in a floating state and the first PLL is opened. In any case mentioned above, the output of a gate 100 is at a low level, and therefore, phase comparator output II is in a floating state and the second PLL is opened.

When the control input I for the 3-state switch is at a low level, the opening-closing states of the gates 99 and 100 are opposite to the above-mentioned states. Therefore, in this case, the phase comparator output I makes the first PLL open, and the phase comparator output II controls the low pass filter 30 connected to the terminal 102 so as to make the second PLL open or closed. When the PLL is locked, a low level output is obtained from the terminal 103 for phase lock detection, and in another case, a pulse output is obtained.

A practical example of the part which connects the PLL to the search tuning system is shown in FIG. 8. Referring to FIG. 8, element 61 is a frequency discriminator and corresponds to element 38 or 50 shown in FIG. 2. Element 62 is formed as a voltage subtracter, but this subtracter corresponds to voltage adders 40 or 52 shown in FIG. 2. Element 63 is a voltage integrator controller and corresponds to controllers 41 or 53 shown in FIG. 2. A terminal 64 is connected to an output terminal of a PLL-search-switch circuit 34. Element 65 is an integrating resistor and element 66 is an integrating capacitor. An operational amplifier 67 forms a voltage integrator with the elements 65 and 66. Point 68 corresponds to the output terminals of the 3-state switch circuit 22. Element 69 is a low pass filter of the PLL and corresponds to the elements 23 or 30 shown in FIG. 2. A voltage adder 70 having a gain of one connects the PLL to the search tuning system, and an output terminal 71 is connected to the voltage controlled local oscillator, which corresponds to elements 17 or 29 shown in FIG. 2. This voltage adder 70 corresponds to voltage adders 24 or 31 shown in FIG. 2.

As previously described, during the PLL time $T_1$, the output of voltage integrators 42 or 54, which are formed by the elements 65, 66 and 67 shown in FIG. 8, is required to be kept at a sweep-starting reference voltage. In the case of FIG. 8, the grounded voltage is taken as this voltage. For this operation, a positive voltage with respect to the gound voltage is to be applied to the integrating resistor 65 from the voltage subtracter 62. If, during the time $T_1$, a positive voltage is applied to terminal 64 from the PLL-search-switch circuit 34 as shown in FIG. 2, this state can be obtained, because a transistor 72 is conducted and therefore the voltage of (−) terminal of the voltage subtractor 62 becomes lower than the voltage of the (+) terminal thereof. Here, in case of no input into the discriminator, its output voltage is positive, for example 6.5 volts.

Next, during the time $T_2$, the grounded voltage, or 0 volts, is applied to terminal 64 from the PLL-search-switch circuit 34. Because of the non-conducting of the transistor 72, divided voltage of the (+) B power source developed by a variable resistor 73 and a resistor 74 is applied to the (−) input terminal of the voltage subtractor 62. This voltage is made higher than the 6.5 volts mentioned above, for example 9 volts. In this manner, the divided voltage, 6.5 volts−9 volts=−2.5 volts, is applied to the voltage integrator formed by the elements 65, 66 and 67 from the voltage subtractor 62, and its output voltage is brought to the sweep state.

As described with reference to FIGS. 4a, and 4b and equations (1) to (4), during the time $T_2$ mentioned above, even though the swept voltage is applied to the PLL, the local oscillation frequency has a very small error with respect to the predetermined frequency $f_o$ close to the transmitting frequency of the desired receiving channel. In the phase-lock detector 35 shown in FIG. 2, the low pass filter is incorporated and is designed so as to obtain its output as the PLL-locked signal even for this small error. In the example of FIG. 7, it is zero volts.

Because the predetermined frequency $f_o$ close to the local oscillation frequency corresponding to the transmitting frequency of the desired receiving channel is out of the frequency-lock range of the search tuning system in the previous explanation of the system operation, there exists the time period $T_3$ shown in FIG. 3. But if the predetermined frequency $f_o$ is settled in the range of frequency lock of the search tuning system, the time $T_3$ vanishes, and operation state changes directly from the state in $T_2$ to the state in $T_4$. In the condition such that the drift of the transmitting frequency is not so large and the transmitting frequency is in the range of frequency lock of the search tuning system, the PLL can be designed so that it locks said predetermined frequency $f_o$.

Further, in the embodiment shown in FIG. 2, the first and second PLL frequency synthesizers and the first and the second search tuning systems are shown, that is, the channel selector for two receivers are shown. But even in the case in which the number of receivers is more than two, it is understood that the operation mentioned above can be effected.

Furthermore, in the embodiment shown in FIG. 2 and the practical example of its part shown in FIG. 8, the low pass filter of the PLL and the voltage integrator are independently indicated and the configuration such that the outputs of those are added as is shown in the voltage adder. But in the case in which there is no need to precisely design the desired characteristics of the PLL and the desired characteristics of the search tuning system, the integrating elements of the low pass filter of the PLL can also be used as the integrating elements of the voltage integrator.

Still furthermore, in FIG. 2 and in FIG. 8, the configuration example of the voltage sweeping circuit is indicated using the sweep-driving-voltage source, the voltage adder, the voltage integrator controller and the voltage integrator. But this circuit can be the voltage sweeping circuit which is used in so-called automatic tuning system such that when the sweeping local oscillation frequency reaches the nominal frequency, the sweep is stopped and then receiving state continues by the negative feedback loop.

Figure 9:
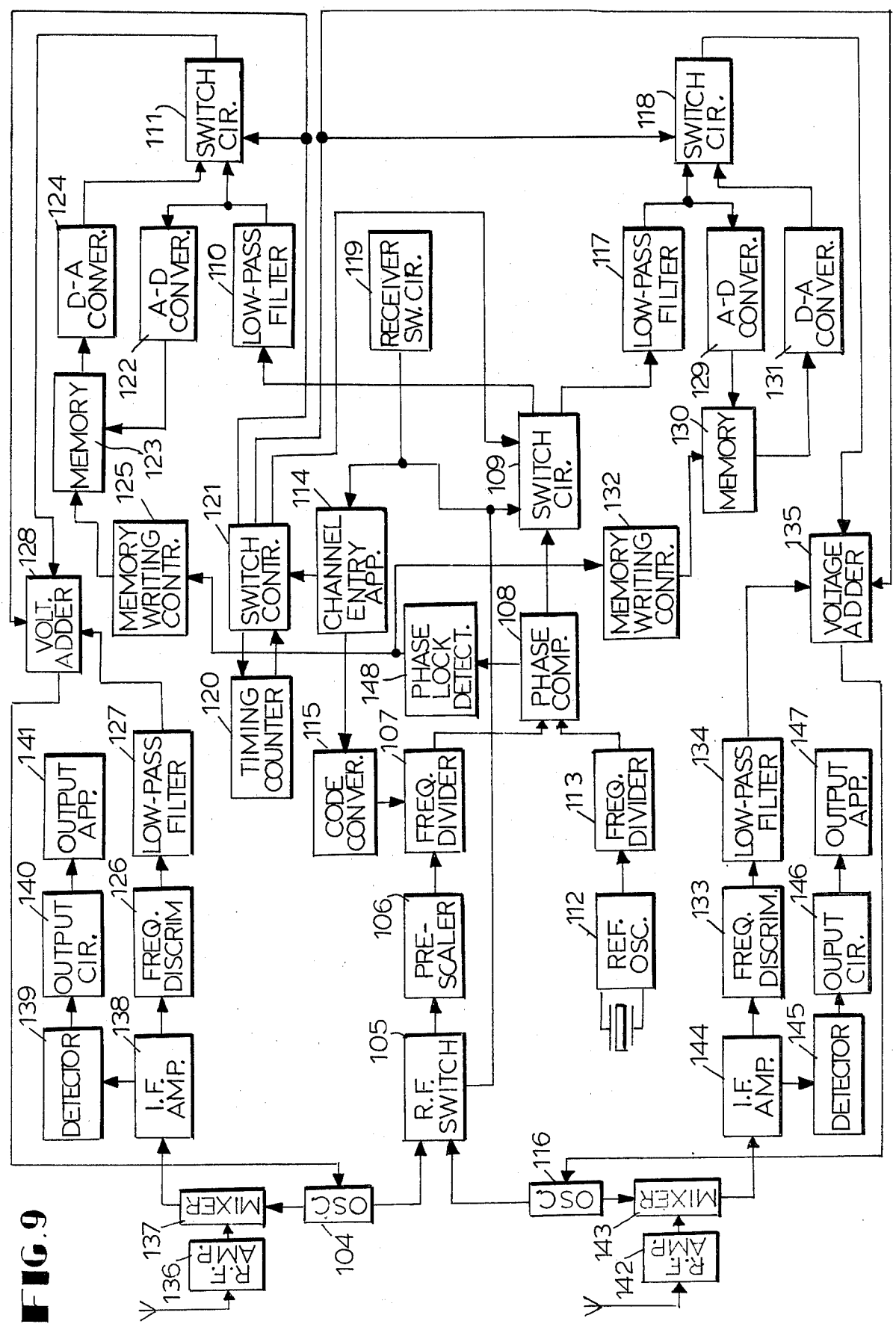
FIG. 9 is a block diagram of another embodiment of the present invention.

The second embodiment of this invention is shown in FIG. 9. Referring to FIG. 9, two PLL frequency synthesizers are shown. The first one has a loop consisting of a local oscillator (voltage controlled oscillator) 104, a radio frequency switch 105, a prescaler 106, a programmable frequency divider 107, a phase comparator 108, a 3-state switch circuit 109, a low pass filter 110, PLL-memory switch circuit 111 and a voltage adder 128 and has a configuration such that an output of a reference oscillator 112 is divided by a reference frequency divider 113 and applied to an input terminal of the phase comparator 108, and an output code of a code converter 115 controlled by a channel entry apparatus 114 determines a frequency dividing ratio of the programmable frequency divider 107, the output of which is applied to the other input terminal of the phase comparator 108.

The second PLL frequency synthesizer has a loop consisting of a local oscillator (voltage controlled oscillator) 116, the radio frequency switch 105, the prescaler 106, the programmable frequency divider 107, the phase comparator 108, the 3-state switch circuit 109, a low pass filter 117, a PLL-memory switch circuit 118 and a voltage adder 135, and has a configuration such that an output of the reference oscillator 112 is divided by the reference frequency divider 113 and applied to the input terminal of the phase comparator 108, and that an output code of the code converter 115 controlled by the channel entry apparatus 114 determines a frequency dividing ratio of the programmable frequency divider 107, the output of which is applied to the other input terminal of the phase comparator 108. Therefore, the second PLL frequency synthesizer uses the prescaler 106, the programmable frequency divider 107, the phase comparator 108, the reference oscillator 112, the reference frequency divider 113, the channel entry apparatus 114 and the code converter 115 commonly with the first PLL frequency synthesizer. Here, one of these or a part of the combination of these is defined as a main part of the PLL frequency synthesizer. A receiver switch circuit 119 controls the radio frequency switch 105 and the 3-state switch circuit 109 so as to close either of the loops used in the first or the second PLL frequency synthesizer mentioned above.

A PLL timing counter 120 is for counting the time which determines the period while the PLL is closed, and a PLL-memory switch controller 121 is controlled by the PLL timing counter 120 and the channel entry apparatus 114.

Further, in FIG. 9, two tuning systems each of which consists of a voltage memory apparatus and an automatic frequency control (AFC) apparatus are shown. The first tuning system is formed so that an output of the voltage memory apparatus which consists of an A-D converter (analog-digital converter) 122, a digital memory 123, a D-A converter (digital-analog converter) 124 and a memory writing controller 125, and an output of the AFC obtained by a frequency discriminator 126 and a low pass filter 127 are added in a voltage adder 128 and applied to the local oscillator 104. The second tuning system is formed so that an output of the memory apparatus which consists of an A-D converter 129, a digital memory 130, a D-A converter 131 and memory writing controller 132, and an output of the AFC obtained by a frequency discriminator 133 and a low pass filter 134 are added in a voltage adder 135 and applied to the local oscillator 116.

In the first receiver, a receiving signal is amplified in a radio frequency amplifier 136, mixed in a mixer 137 with an output of a local oscillator 104 and produces intermediate frequency. The intermediate frequency is amplified in an intermediate amplifier 138, the output of which is applied to the frequency discriminator 126 and to a detector 139. The detected signal is applied to an output apparatus 141 through an output circuit 140. In the second receiver, there is a radio frequency amplifier 142, a mixer 143, an intermediate frequency amplifier 144, a detector 145, an output circuit 146 and an output apparatus 147 which operate in the similar manner to those in the first receiver.

Furthermore, there is a phase lock detector 148 arranged so as to control the memory writing controllers 125 and 132 by means of information from the phase comparator 108.

The radio frequency switch circuit 105 and the 3-state switch circuit 109 are controlled by the receiver switch circuit 119 and the above-mentioned first frequency synthesizer is ready to operate. In other words, the first receiver is ready to select a channel. Then, among the stations which can be received by this receiver, the channel number or the receiving frequency of the desired receiving station is selected by the channel entry apparatus 114.

The dividing ratio corresponding to the selected channel is loaded in the programmable frequency divider 107 through the code converter 115. At the same time, the channel entry apparatus 114 controls the PLL-memory switch controller 121, and the output of this controller 121 switches the 3-state switch circuit 109 and the PLL-memory switch circuit 111, and controls the voltage adder 128 so as to close the first PLL. While the PLL is closed, no AFC voltage is applied to the voltage adder 128. If the PLL is locked into a phase-lock state, a signal for controlling the memory writing controller 125 is obtained from the phase-lock detector 148. Receiving this signal, the memory writing controller 125 applies a writing signal to the digital memory 123 so that a digitalized output voltage of the low pass filter 110 through the A-D converter 122 is stored as data in the digital memory 123. During PLL timing determined by PLL timing counter 120, the memory writing is effected.

After the PLL time, the PLL-memory switch controller 121 switches the receiver from the PLL mode to the voltage-memory mode. The data stored in the digital memory 123 is converted to an analog voltage, which is applied to local oscillator 104 as a tuning voltage through the PLL-memory switch circuit 111 and the voltage adder 128. In the voltage memory mode, the receiver is controlled so that the AFC voltage is added from the low pass filter 127 to the voltage adder 128.

Assume that the first receiver continues receiving in the previously mentioned manner, and the second receiver will receive another new desired receiving station. In order to operate the second receiver, the second PLL frequency synthesizer must first be operated. For this operation, an output of a receiver switch apparatus 119 controls the radio frequency switch circuit 105 and the 3-state switch circuit 109 so that the loop consisting of a local oscillator 116, the radio frequency switch circuit 105, the prescaler 106, the programmable frequency divider 107, the phase comparator 108, the 3-state switch circuit 109, the low pass filter 117, the PLL-memory switch circuit 118 and the voltage adder 135 is closed. After closing the loop, a channel number or a receiving frequency of a desired receiving station is selected by the channel entry apparatus 114.

The following operation which takes place in the PLL mode and in the voltage memory mode can be understood from the operation already mentioned above with regard to the first receiver.

In FIG. 2, the digital memory is shown as the voltage memory, but an analog memory which stores analog voltages can instead be used for the voltage memory. Moreover, in FIG. 2, two receivers are shown, but this invention can be applied to a plurality of receivers which are more than two.

Accordingly, this invention has following features.

(1) Since a plurality of receivers have the main part of the PLL frequency synthesizers for common use, the channel selector according to this invention is more advantageous in the view point of cost than the case in which each receiver has one PLL frequency synthesizer.

(2) The programmable frequency divider, the phase comparator, the reference oscillator and the reference frequency divider are the fundamental construction elements of the PLL frequency synthesizer, and this part can be produced on a single chip of digital LSI. If this part is ready to be commonly used in the plurality of receivers, this usage causes a variety of combinations of the receivers.

(3) The operating frequency of a prescaler must be 1 GHz for the case of a television receiver, and its power consumption is large because of the use of ECL (emitter coupled logic), which is commonly used these days. Therefore, the common use of only this part causes the advantage of lowered cost and power consumption.

(4) The channel entry apparatus and the code converter are desired to be made of a single chip microcomputer because of the need of multifunction useage such as station programming and remote control of a receiver. In the case in which the plurality of receivers are commonly controlled by single chip microcomputer according to this invention, there is advantage in the view point of lowered cost.

(5) In the case of the configuration such that an input is applied to one low pass filter among a plurality of low pass filters by the 3-state circuit in order to commonly use the main part of the PLL frequency synthesizer, even if broadcast frequency bands are widely apart from each other as a television channel selector for UHF band and VHF band or as a channel selector for an FM radio and an AM radio, circuit constants of the low pass filter having adequate characteristics with respect to each broadcast frequency band can be easily designed.

(6) In contrast to a channel selector (such that the plurality of the receivers commonly use the main part of the PLL frequency synthesizer, and after the PLL frequency synthesizer selects a desired receiving channel, the tuning voltage of which is digitalized so as to be stored in a digital memory, and while receiving the signal, the digitalized data is converted to an analog voltage by the digital-analog converter to control the radio frequency amplifier and the local oscillator), the automatic frequency control can be omitted by the construction such that after the PLL frequency synthesizer selects the channel, the search tuning system tunes the signal.

(7) In the channel selector such that each of a plurality of receivers stores a plurality of tuning voltages in resistors or digital memories, and when receiving, a tuning voltage corresponding to a desired receiving channel among the plurality of the tuning voltages is selected, the memory apparatus for storing the tuning voltages becomes large. On the other hand, according to the second embodiment of this invention, the PLL frequency synthesizer operates until the tuning voltage is obtained, and the main part of the PLL frequency synthesizer is commonly used in the plurality of receivers. Therefore, only one voltage memory is needed for each receiver, and the part of the voltage memory can be formed in a small size and at a low cost.

In the previous explanation of the features, the expression "common use" or "commonly used" is used, but this expression does not simply mean common use of a main part of PLL frequency synthesizer of conventional AM-FM radio receivers. As described in the above detailed explanation of the embodiments, there is the advantage of this invention in the common use of the main part of the PLL frequency synthesizer which is incorporated in plural receivers to perform simultaneous receiving operations.

What is claimed is:

1. A channel selector for controlling the tuning frequency of a plurality of receivers capable of simultaneously performing receiving operations, each of said plurality of receivers having a portion of a phase-locked loop frequency synthesizer; wherein another portion of a phase-locked loop frequency synthesizer is commonly used by said portions of said synthesizers whereby each of said plurality of receivers has an equivalent complete phase-locked loop frequency synthesizer;

and wherein each of said plurality of receivers has its own low pass filter included in its equivalent phase-locked loop frequency synthesizer, and an output of a phase comparator is switched to an input terminal of one low pass filter from among said plurality of low pass filters by a 3-state switching circuit.

2. A channel selector according to claim 1, wherein said common portion of each of said equivalent phase-locked loop frequency synthesizers comprises a programmable frequency divider, a phase comparator, a reference oscillator and a reference frequency divider.

3. A channel selector according to claim 1, wherein said common portion of each of said equivalent phase-locked loop frequency synthesizers comprises a prescaler.

4. A channel selector according to claim 1, wherein said common portion of each of said equivalent phase-locked loop frequency synthesizers comprises a channel entry means and a code converter means.

5. A channel selector for controlling the tuning frequency of a plurality of receivers capable of simultaneously performing receiving operations, each of said plurality of receivers having a portion of a phase-locked loop frequency synthesizer; wherein another portion of a phase-locked loop frequency synthesizer is commonly used by said portions of said synthesizers whereby each of said plurality of receivers has an equivalent complete phase-locked loop frequency synthesizer;

and wherein each of said equivalent phase-locked loop frequency synthesizers is controlled so that a local oscillation frequency corresponding to a predetermined frequency close to a broadcast signal of a desired receiving channel is synthesized, and one of a plurality of search tuning systems searches and tunes said broadcast signal from said local oscillation frequency whereby said broadcast signal of said desired receiving channel is tuned.

6. A channel selector for controlling the tuning frequency of a plurality of receivers capable of simultaneously performing receiving operations, each of said plurality of receivers having a portion of a phase-locked loop frequency synthesizer; wherein another portion of a phase-locked loop frequency synthesizer is commonly used by said portions of said synthesizers whereby each of said plurality of receivers has an equivalent complete phase-locked loop frequency synthesizer;

and wherein each of said phase-locked loop frequency synthesizers selects a desired receiving channel, and wherein a tuning voltage of said desired receiving channel is stored in a voltage memory means, and wherein said channel selector further comprises a tuning means provided for each of said plurality of receivers so that while receiving, said tuning means tunes in accordance with the output of said voltage memory means.

7. A channel selector according to claims 5 or 6, wherein said common portion of each of said equivalent phase-locked loop frequency synthesizers comprises a programmable frequency divider, a phase comparator, a reference oscillator and a reference frequency divider.

8. A channel selector according to claims 5 or 6, wherein said common portion of each of said equivalent phase-locked loop frequency synthesizers comprises a prescaler.

9. A channel selector according to claims 5 or 6, wherein said common portion of each of said equivalent phase-locked loop frequency synthesizers comprises a channel entry means and a code converter means.

* * * * *